(12) United States Patent
Berniard et al.

(10) Patent No.: US 9,003,970 B2
(45) Date of Patent: Apr. 14, 2015

(54) SOLVENT ASSISTED METHOD OF MICROCONTACT PRINTING (75) Inventors: Tracie J. Berniard, St. Paul, MN (US); Daniel P. Meehan, St. Paul, MN (US); Matthew H. Frey, Cottage Grove, MN (US); Mikhail L. Pekurovsky, Bloomington, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 1141 days.

(21) Appl. No.: 13/000,846

(22) PCT Filed: Jun. 29, 2009

(86) PCT No.: PCT/US2009/049053
§ 371 (c)(1),
(2), (4) Date: Jan. 31, 2011

(87) PCT Pub. No.: WO2010/002788
PCT Pub. Date: Jan. 7, 2010

(65) Prior Publication Data
US 2011/0126730 A1    Jun. 2, 2011

Related U.S. Application Data (60) Provisional application No. 61/077,050, filed on Jun. 30, 2008.

(51) Int. Cl.
G03F 7/00 (2006.01)
B82Y 10/00 (2011.01)
B82Y 40/00 (2011.01)

(52) U.S. Cl.
CPC ............... *G03F 7/0002* (2013.01); *B82Y 10/00* (2013.01); *B82Y 40/00* (2013.01)

(58) Field of Classification Search
CPC ..................................................... G03F 7/0002
See application file for complete search history.

(56) References Cited

U.S. PATENT DOCUMENTS 5,392,711 A   2/1995  Kainuma
5,512,131 A   4/1996  Kumar et al.
(Continued)

FOREIGN PATENT DOCUMENTS

WO   WO 98/27463 A1    6/1998
WO   WO 02/085639 A1   10/2002
(Continued)

OTHER PUBLICATIONS

Asakura et al., "Fabrication of Microstructured Copper on an Indium—tin—oxide Surface Using a Micropatterned Self-assembled Monolayer as a Template", Jul./Aug. 2003, *Journal of Vacuum Science and Technology A*, vol. 21, No. 4, pp. 1152-1156.
(Continued)

*Primary Examiner* — Joshua D Zimmerman
(74) *Attorney, Agent, or Firm* — Adrian L. Pishko; Gregory D. Allen (57) ABSTRACT A method of microcontact printing comprises (a) providing an elastomeric stamp comprising a printing surface inked with an ink comprising surface-functionalizing molecules, (b) treating the inked printing surface of the stamp with solvent, and (c) contacting the treated inked printing surface of the stamp to a surface of a substrate. The printing surface of the stamp comprises a first relief pattern, or the surface of the substrate comprises a second relief pattern, or both of the surfaces comprise the relief patterns, and a pattern of surface-functionalizing molecules is transferred to the substrate according to one or both of the relief patterns.

22 Claims, 4 Drawing Sheets (56) References Cited

U.S. PATENT DOCUMENTS

| | | | |
|---|---|---|---|
| 6,180,239 | B1 | 1/2001 | Whitesides et al. |
| 6,376,065 | B1 | 4/2002 | Korba et al. |
| 6,739,255 | B2 | 5/2004 | Blees et al. |
| 6,747,074 | B1 | 6/2004 | Buckingham et al. |
| 2002/0071943 | A1 | 6/2002 | Hawker et al. |
| 2003/0047535 | A1 | 3/2003 | Schueller et al. |
| 2005/0166791 | A1 | 8/2005 | Flynn et al. |

FOREIGN PATENT DOCUMENTS

| | | |
|---|---|---|
| WO | WO 2005/035257 A1 | 4/2005 |
| WO | WO 2006/043244 A1 | 4/2006 |

OTHER PUBLICATIONS

Clem et al., "Micron Scale Patterning of Solution-derived Ceramic Thin Films Directed by Self-assembled Monolayers", 1996, *Materials Research Society Symposium Proceedings*, vol. 435, pp. 521-526.

Delamarche et al., "Microcontact Printing Using Poly(dimethylsiloxane) Stamps Hydrophilized by Poly(ethylene oxide) Silanes", 2003, *Langmuir*, vol. 19, No. 21, pp. 8749-8758.

Hare et al., "Properties of Films of Adsorbed Fluorinated Acids", Mar. 1954, *Journal of Physical Chemistry*, vol. 58, No. 3, pp. 236-239.

Hare et al., "Autophobic Liquids and the Properties of Their Adsorbed Films", Apr. 1955, *Journal of Physical Chemistry*, vol. 59, No. 4, pp. 335-340.

Jeon et al., "Patterned Self-assembled Monolayers Formed by Microcontact Printing Direct Selective Metalization by Chemical Vapor Deposition on Planar and Nonplanar Substrates", 1995, *Langmuir*, vol. 11, No. 8, pp. 3024-3026.

Kim et al, Reprint of "Fabrication of Nano-structures Using Inverse-μCP Technique with a Flat PDMS Stamp", 2007, *Sensors and Actuators A*, vol. 139, pp. 356-363.

Kumar et al., "Features of Gold Having Micrometer to Centimeter Dimensions can be Formed Through a Combination of Stamping with an Elastomeric Stamp and an Alkanethiol "Ink" Followed by Chemical Etching", Oct. 4, 1993, *Applied Physics Letters*, vol. 63, No. 14, pp. 2002-2004.

Lee et al., "Solvent Compatibility of Poly(dimethylsiloxane)-based Microfluidic Devices", Dec. 1, 2003, *Analytical Chemistry*, vol. 75, No. 23, pp. 6544-6554.

Libioulle et al., "Contact-inking Stamps for Microcontact Printing of Alkanethiols on Gold", 1999, *Langmuir*, vol. 15, No. 2, pp. 300-304.

Love et al., "Self-assembled Monolayers of Thiolates on Metals as a Form of Nanotechnology", 2005, *Chemical Reviews*, vol. 105. No. 4, pp. 1103-1169.

Reichardt, *Solvents and Solvent Effects in Organic Chemistry $2^{nd}$ Ed.*, VCH Verlagsgesellschaft mbH, Germany, pp. 363-375 (1988).

Ulman, "Formation and Structure of Self-assembled Monolayers", 1996, *Chemical Reviews*, vol. 96, No. 4, pp. 1533-1554.

Wu et al., "Solvent-assisted Dye-diffusion Thermal Transfer for Electronic Imaging Applications", Feb. 18, 2002, *Applied Physics Letters*, vol. 80, No. 7, pp. 1117-1119.

Xia et al., "Microcontact Printing with a Cylindrical Rolling Stamp: A Practical Step Toward Automatic Manufacturing of Patterns with Submicrometer-sized Features", 1996, *Advanced Materials*, vol. 8, No. 12, pp. 1015-1017.

Xia et al., "Soft Lithography", 1998, *Angew. Chem. Int. Ed.*, vol. 37, pp. 551-575.

International Search Report for PCT/US2009/049053, 4 pgs.

SOLVENT ASSISTED METHOD OF MICROCONTACT PRINTING

CROSS REFERENCE TO RELATED APPLICATIONS

This application is a national stage filing under 35 U.S.C. 371 of PCT/US2009/049053, filed Jun. 29, 2009, which claims priority of U.S. Provisional Application No. 61/077,050, filed Jun. 30,2008, the disclosure of which is incorporated by reference in its/their entirety herein.

FIELD

This invention relates to a method of microcontact printing that is useful, for example, for printing self-assembled monolayers.

BACKGROUND

Microcontact printing is a printing technique that can be used, for example, to generate patterns of functionalizing molecules (that is, molecules that attach to a substrate surface or coated substrate surface via a chemical bond) to form a patterned self-assembled monolayer (SAM) (that is, a single layer of molecules that are attached, for example, by a chemical bond to a surface and that have adopted a preferred orientation with respect to that surface and even with respect to each other).

A basic method for microcontact printing SAMs involves applying an ink containing functionalizing molecules to a relief-patterned elastomeric stamp (for example, a poly(dimethylsiloxane) (PDMS) stamp) and then contacting the inked stamp to a substrate surface, usually a metal or metal oxide surface, so that SAMs form in the regions of contact between the stamp and the substrate. Alternatively, the elastomeric stamp can be flat (that is, not containing a relief pattern) and the substrate surface can be relief-patterned.

Micropatterned organic and inorganic materials printed using microcontact printing methods can potentially provide unique electrical, optical, and/or biological properties to substrates such as metallized polymeric films. It has proven difficult, however, to obtain good (that is, complete and even) functionalizing molecule coverage using known microcontact printing methods continuously, repeatedly, and/or at high rates.

SUMMARY

In view of the foregoing, we recognize that there is a need in the art for an improved method of microcontact printing that provides good functionalizing material coverage. Furthermore, in order for microcontact printing to be commercially attractive, we recognize that there is a need for a method of microcontact printing that can be carried out in a continuous manner, repeated times, and/or at high rates.

Briefly, the present invention provides an improved method of microcontact printing. The method comprises (a) providing an elastomeric stamp comprising a printing surface inked with an ink comprising surface-functionalizing molecules, (b) treating the inked printing surface of the stamp with solvent, and (c) contacting the treated inked printing surface of the stamp to a surface of a substrate. The printing surface of the stamp, the surface of the substrate, or both comprise a relief pattern. A pattern of surface-functionalizing molecules is transferred to the substrate according to one or both of the relief patterns.

The method of microcontact printing of the present invention provides good functionalizing molecule coverage. It can also be carried out in a continuous manner, repeated times and/or at high rates.

DETAILED DESCRIPTION

The microcontact printing method of the present invention involves applying an ink containing functionalizing molecules to a relief-patterned elastomeric stamp and then contacting the inked stamp to a substrate surface so that a pattern of surface-functionalizing molecules forms in the regions of contact between the stamp and the substrate.

Inks that are useful in the present invention comprise surface-functionalizing molecules. As used herein, the term "surface-functionalizing molecules" includes molecules that adsorb to a surface by chemical or physical adsorption. Preferred surface-functionalizing molecules form a self-assembled monolayer (SAM). A SAM generally refers to a layer of molecules that are attached (for example, by a chemical bond) to a surface and that have adopted a preferred orientation with respect to that surface and even with respect to each other. SAMS have been shown to cover surfaces so completely that the properties of that surface are changed. For example, application of a SAM can result in a surface energy reduction and allow selective etching of metal that is not coated with the SAM. Examples of surface-functionalizing molecules include organosulfur compounds, organosilanes, phosphonic acids, carboxylic acids, and benzotriazoles.

Organosilanes (for example, alkylchlorosilanes, alkylalkoxysilanes, and alkylaminosilanes) can form SAMs on hydroxylated surfaces. A preferred organosilane is octadecyltrichlorosilane. Useful organosilanes typically include one, two, or three readily hydrolysable groups. For example, useful organosilanes include monochlorosilanes, dichlorosilanes, and trichlorosilanes. Similarly, monoalkoxysilanes, dialkoxysilanes, and trialkoxysilanes are useful. Readily hydrolysable groups occupy one or more of positions R1, R2, and R3 in the following formula. In addition to one or more readily hydrolysable groups, useful organosilanes include a tail group. Typically, the tail group takes the form of an alkyl chain with some end group:

wherein n is the number of methylene units and X is the end group of the alkyl chain (for example, X=—$CH_3$, —OH, —COOH, —$NH_2$, or the like). Preferably, X=—$CH_3$. The invention is not limited in terms of the chemical identity of the end group for the useful linear alkyl silanes. Useful organosilanes can be linear organosilanes (that is, straight chain alkyl silanes) or branched and can be substituted or unsubstituted. The optional substituents preferably do not interfere with the formation of a SAM. Examples of mid-chain substituents within useful alkyl silanes include ether groups and aromatic rings. The invention is not limited in terms of the optional branching structure or the chemical identity of any optional mid-chain substituents. Useful organosilanes include those described, for example, in Ulman, "Formation and Structure of Self-Assembled Monolayers," *Chemical Reviews* Vol. 96, pp. 1533-1554 (1996) and those commercially available from Gelest, Inc., Morrisville, Pa.

Useful phosphonic acids, carboxylic acids, and benzotriazoles also include a chemical site for binding to and functionalizing a surface. Useful benzotriazoles include 1H-benzotriazole, as well as related compounds described in U.S. Patent Application Publication No. 20050166791 and U.S. Pat. No. 6,376,065. Useful phosphonic acids are molecules with the general chemical formula RP(O)(OH)$_2$, wherein R represents and organic group, including an unsubstituted or substituted alkyl group, optionally with an end group other than a methyl group, for example an —OH group or —NH$_2$ group. Useful phosphonic acids include molecules described in Ulman, "Formation and Structure of Self-Assembled Monolayers," *Chemical Reviews* Vol. 96, pp. 1533-1554 (1996). Useful carboxylic acids include fatty acids and other molecules described in (1) Ulman, "Formation and Structure of Self-Assembled Monolayers," *Chemical Reviews* Vol. 96, pp. 1533-1554 (1996); (2) E. F. Hare, Shafrin, and W. A. Zisman, "Properties of films of adsorbed fluorinated acids," *Journal of Physical Chemistry*, Vol. 58, No. 3, pp. 236-239 (1954); and (3) E. F. Hare and W. A. Zisman, "Autophobic liquids and the properties of their adsorbed films," *Journal of Physical Chemistry*, Vol. 59, No. 4, pp. 335-340 (1955).

Preferably, the ink comprises organosulfur compounds; more preferably, the ink comprises thiol compounds. Thiols are alternatively called mercaptans. The thiol group is useful for creating a chemical bond between molecules of the compound and the surface of a metal. Useful thiols of the present invention include alkyl thiols and aryl thiols. Other useful organosulfur compounds of the present invention are dialkyl disulfides, dialkyl sulfides, alkyl xanthates, dithiophosphates, and dialkylthiocarbamates. The useful chemical structures and substituents for thiols, as described herein, also apply to the other useful organosulfur compounds.

Preferably the ink solution comprises alkyl thiols such as, for example, linear alkyl thiols:

wherein n is the number of methylene units and X is the end group of the alkyl chain (for example, X=—CH$_3$, —OH, —COOH, —NH$_2$, or the like). Preferably, X=—CH$_3$. The invention is not limited in terms of the chemical identity of the end group for the useful linear alkyl thiols. Useful end groups include those described, for example, in: (1) Ulman, "Formation and Structure of Self-Assembled Monolayers," *Chemical Reviews* Vol. 96, pp. 1533-1554 (1996); and (2) Love et al., "Self-Assembled Monolayers of Thiolates on Metals as a Form of Nanotechnology," *Chemical Reviews* Vol. 105, pp. 1103-1169 (2005).

Useful alkyl thiols can be linear alkyl thiols (that is, straight chain alkyl thiols) or branched and can be substituted or unsubstituted. The optional substituents preferably do not interfere with the formation of a SAM. Examples of branched alkyl thiols that are useful include alkyl thiols with a methyl group attached to every third or every fourth carbon atom of a linear alkyl chain backbone (for example, phytanylthiol). Examples of mid-chain substituents within useful alkyl thiols include ether groups and aromatic rings. Useful thiols can also include three-dimensional cyclic compounds (for example, 1-adamantanethiol). The invention is not limited in terms of the optional branching structure or the chemical identity of any optional mid-chain substituents.

Preferred linear alkyl thiols have 10 to 20 carbon atoms (more preferably, 12 to 20 carbon atoms; even more preferably 16 carbon atoms, 18 carbon atoms, or 20 carbon atoms; most preferably 16 carbon atoms or 18 carbon atoms).

Suitable alkyl thiols include commercially available alkyl thiols (Aldrich Chemical Company, Milwaukee, Wis.). Preferably, the ink solutions consist primarily of a solvent and the organosulfur compound, with impurities comprising less than about 5 percent by weight of the ink solution; more preferably less than about 1 percent; even more preferably less than about 0.1 percent. Common impurities in alkyl thiol solutions are dialkyl disulfides, an oxidation product of alkyl thiols. As is known in the art, dialkyl disulfides are also useful for microcontact printing patterns of functionalizing molecules. Useful inks according to the invention can contain mixtures of different organosulfur compounds dissolved in a common solvent such as, for example, mixtures of alkyl thiol and dialkyl disulfide.

Aryl thiols are also useful. Aryl thiols include a thiol group attached to an aromatic ring. Examples of useful aryl thiols include biphenyl thiols and terphenyl thiols. The biphenyl and terphenyl thiols can be substituted with one or more functional groups at any of a variety of locations. Other examples of useful aryl thiols include acene thiols, which may or may not be substituted with functional groups. The invention is not limited in terms of the presence or absence of aryl groups in the thiol molecules.

Useful thiols can include linear conjugated carbon-carbon bonds, for example double bonds or triple bonds. Useful thiols can be partially or completely fluorinated.

Ink solutions useful in the present invention can include two or more chemically distinct organosulfur compounds. For example, the ink can include two linear alkyl thiol compounds with different chain length. As another example, the ink can include two linear alkyl thiol compounds with different tail groups.

Although microcontact printing has been carried out using neat organosulfur compounds to ink the stamp, the delivery of organosulfur compounds to the stamp are typically delivered from a solvent-based ink. One or more solvents may be included in ink formulations Inks formulations may also contain small amounts of impurities or additives, for example stabilizers or desiccants.

Properties that are taken into consideration when choosing a solvent for an ink formulation include (i) the ability to dissolve greater concentrations of the surface-functionalizing molecule (for example, linear alkyl thiol) with greater stability (for example, shelf life); (ii) the ability to charge the surface-functionalizing molecule (for example linear alkyl thiol) onto or into a PDMS stamp without excessive swelling of the PDMS; and (iii) the ability to remove liquid solvent from the stamp surface rapidly by drying, after inking.

The surface-functionalizing molecules can be dissolved in a solvent. In some instances, it is important for the solvent to have tailored drying behavior for rapid and uniform deposition of the organosulfur compound on or within the stamp. The need for this tailored drying behavior follows from the requirement for a manufacturing process to proceed at a high rate. Useful solvents typically have a boiling point between about 50° C. and about 150° C. (at atmospheric pressure). Preferably, the solvent has a boiling point between about 55° C. and about 125° C. (at atmospheric pressure). More preferably, the solvent has a boiling point between about 60° C. and about 90° C. (at atmospheric pressure).

Useful solvents for ink formulation are preferably compatible with PDMS (that is, they do not excessively swell PDMS), which is the most commonly used material for microcontact printing. Some common solvents can swell PDMS too much to be used effectively in microcontact printing. In microcontact printing, swelling of the PDMS stamp can lead to distortion of the patterned features and poor pattern fidelity. Depending on the inking approach, excessive swelling can also present significant challenges in providing mechanical support to the stamp.

Solvents useful in the ink formulation, therefore, preferably have a relatively low poly(dimethylsiloxane) swelling ratio. As used herein, a "poly(dimethylsiloxane) swelling ratio" or a "PDMS swelling ratio" means $D/D_0$, wherein D is the length of a piece of PDMS in a solvent and $D_0$ is the length of the same piece of PDMS when dry. More specifically, as used herein, "poly(dimethylsiloxane) swelling ratio" refers to the ratio, calculated as described above, for Sylgard™ 184 PDMS, commercially obtainable from Dow Corning, Midland, Mich. The procedure for measuring the swelling ratio is described in Lee et al., "Solvent Compatibility of Poly(dimethylsiloxane)-Based Microfluidic Devices, *Analytical Chemistry* Vol. 75, pp. 6544-6554 (2003). The procedure is briefly described here: The two PDMS components (base and curing agent) are mixed at 10:1 ratio by weight (base:curing agent) and degassed under vacuum. The mixture of base and curing agent is cured into a sheet with approximately 1 millimeter thickness at 70° C. for 24 hours. Hexagonal-shaped samples are cut from the sheet, measuring approximately 4 millimeters from one face to the opposite face (of the hexagon). The piece of PDMS is immersed in the solvent to be tested for 24 hours at 25° C. The distance between opposing faces of the hexagon (D) is measured using a stereoscope and a charge-coupled device (CCD) camera, while the PDMS sample is immersed in the solvent, and compared with the starting distance ($D_0$). Preferably, the solvent has a PDMS swelling ratio of less than about 1.25 (more preferably less than about 1.10; most preferably 1.06 or less).

Preferred solvent for ink formulations have a relative polarity of less than about 0.8. Preferably, useful solvents have a relative polarity of less than about 0.7. More preferably, the solvent has a relative polarity between about 0.2 and about 0.7. The relative polarity is the normalized transition energy for the longest wavelength solvatochromic absorption band of the pyridinium-N-phenoxide betaine dye, as described in detail in *Solvents and Solvent Effects in Organic Chemistry*, Second Edition, C. Reichardt, VCH Verlagsgesellschaft mbH, Germany (1988). The normalization creates a unitless relative polarity scale bounded by tetramethylsilane at 0.000 and water at 1.000. Values of relative polarity for most solvents can be found in the aforementioned volume by Reichardt.

Examples of useful solvents for the ink formulation include methanol, ethanol, toluene, acetone, hexane, ethyl acetate, methyl ethyl ketone, 1-propanol, 2-propanol, water, dimethylformamide, dimethyl sulfoxide, and mixtures thereof.

Typically, the surface-functionalizing molecules (for example, thiol compounds) are present in the solvent in a concentration of about 1 to about 30 mM.

Useful thiol ink formulations are commercially available under the tradename NanoThinks™ from Sigma-Aldrich.

Microcontact printing typically utilizes an elastomeric stamp. Often, the print surface of the elastomeric stamp is relief-patterned. Useful elastomers for forming the stamp include silicones, polyurethanes, ethylene propylene diene monomer (EPDM) rubbers, as well as the range of existing commercially available flexographic printing plate materials (for example, commercially available from E. I. du Pont de Nemours and Company, Wilmington, Del., under the trade name Cyrel™). The stamp can be made from a composite material.

PDMS is particularly useful. It is elastomeric and has a low surface energy, which makes it easy to remove the stamp from most substrates. PDMS is commercially available. A useful commercially available formulation of PDMS is Sylgard™ 184 (Dow Corning, Midland, Mich.). PDMS stamps can be formed, for example, by dispensing an uncrosslinked PDMS polymer into or against a patterned mold, followed by curing. The patterned features can be, for example, millimeter-sized, micrometer-sized or nanometer-sized.

The stamp can be "inked" with the ink solution of the invention using methods known in the art (for example, as described in Libioulle et al. "Contact-Inking Stamps for Microcontact Printing of Alkanethiols on Gold," *Langmuir* Vol. 15, pp. 300-304 (1999)). In one approach, an applicator (for example, a cotton swab or a foam applicator) impregnated with the ink solution can be rubbed across the printing surface of the stamp, followed by drying of solvent from the stamp surface. In another approach, the stamp can be pressed against an "ink pad" impregnated with the ink solution, the ink pad optionally being a PDMS slab. In another approach, the stamp can be charged with ink solution from its back side, relative to the printing surface ("back-side inking"). In back-side inking, the surface-functionalizing molecules diffuse through the stamp to reach printing surface of the stamp. Alternatively, the printing surface of the stamp can be immersed in the ink solution, followed by withdrawal and drying ("immersive inking"). All of the above described methods of inking render the printing surface inked, yielding an "inked printing surface."

Preferably, for the achievement of manufacturing efficiency in the use of the immersive inking approach, it is desired the inking time (that is, the time the stamp is in contact with the ink) is as short as possible, while still yielding an inked stamp with adequate printing performance. For immersive inking it is preferred that the inking time is less than about 60 seconds, more preferably less than about 45 seconds, more preferably less than about 30 seconds, and even more preferably less than about 15 seconds.

According to the method of the present invention, the inked printing surface of the stamp can then be treated with solvent. Treating the inked printing surface with solvent improves the coverage of the surface-functionalizing molecules on the substrate and/or improves stamp life (that is, increases the number of viable surface-functionalizing molecule patterns that can be stamped without re-inking the printing surface).

Treatment solvents that are useful in the method of the present invention include, for example, methanol, ethanol, toluene, acetone, hexane, ethyl acetate, methyl ethyl ketone, 1-propanol, 2-propanol, water, dimethylformamide, dimethyl sulfoxide, pyridine, and mixtures thereof. Additionally, aqueous mixtures of ethanol and acetic acid can be used, as well as buffered solutions.

It should be noted that treatment solvents containing small amounts of surface-functionalizing molecules are still considered to be within the scope of useful treatment solvents for the purposes of this invention. Small amounts of surface-functionalizing molecules can be introduced into the treatment solvent, for example, when a stamp and a quantity of treatment solvent and used repeatedly for making multiple patterns of surface-functionalizing molecules. Any amount of surface-functionalizing molecules that is not enough to be suitable for use as an ink on its own is considered a "small amount."

Useful treatment solvents typically have a boiling point between about 50° C. and about 150° C. (at atmospheric pressure). Preferably, the solvent has a boiling point between about 55° C. and about 125° C. (at atmospheric pressure). More preferably, the solvent has a boiling point between about 60° C. and about 90° C. (at atmospheric pressure).

Preferably, the treatment solvent has a PDMS swelling ratio greater than about 1.0 (preferably, greater than 1.01; more preferably, greater than about 1.04) and less than about 2.0.

Treating the inked printing surface of the stamp with solvent can be accomplished using known coating methods known in the art. For example, coating methods such as dip coating, blade coating, condensation coating, roll coating, slot coating, gravure coating, slide coating, curtain coating, notch coating, spin coating, and the like can be used. Alternatively, the inked printing surface of the stamp can be treated by exposing it to a solvent vapor, leading to dissolution of the solvent molecules within the stamp without the generation of a separate liquid phase of the solvent on the inked printing surface by condensation, referred to herein as vapor-treating. Preferably, the inked printing surface of the stamp is treated with solvent using dip coating, blade coating, condensation coating, vapor-treating, roll coating, or slot coating.

The treatment solvent can be in contact with the inked printing surface of the stamp for less than 10 minutes, less than 1 minute, or even less than 1 second.

The treated inked printing surface of the stamp can then be contacted with the substrate in order to transfer a pattern of the surface-functionalizing molecules to the substrate. The surface-functionalizing molecules diffuse from the stamp onto the surface of the substrate where they can form SAMs.

Preferably, the printing surface is nominally dry before it is contacted with the substrate. In some embodiments of the method of the invention, excess treatment solvent is removed from the treated inked printing surface of the stamp. Preferably, excess solvent is removed using a doctor blade. In other embodiments of the method of the invention, the treated inked printing surface of the stamp is dried to remove bulk liquid from the surface. The stamp can simply be allowed to air dry at ambient conditions or it can be actively dried, for example, by heating or by gas impingement (for example, using a nitrogen gun or bar).

The substrate is the surface onto which the pattern of surface-functionalizing molecules is transferred. The term "substrate" is also used to refer to the physical support under such surface. Typically, the substrate comprises a substantially planar surface. Useful substrates can comprise an inorganic material (for example, metallic or metal oxide material, including polycrystalline materials, or ceramic material) coating on a polymeric film, or on a glass or silicon wafer. The inorganic material coating can include, for example, elemental metal, metal alloys, intermetallic compounds, metal oxides, metal sulfides, metal carbides, metal nitrides, and combinations thereof. Exemplary metallic surfaces for supporting SAMs include gold, silver, palladium, platinum, rhodium, copper, nickel, iron, indium, tin, tantalum, as well as mixtures, alloys, and compounds of these elements. Preferably, the metallic surface comprises gold, silver, palladium, platinum, copper, or nickel. Metal coatings on the polymeric film or glass or silicon wafer substrate can be any thickness such as, for example, from about 10 to about 1000 nanometers. The inorganic material coating can be deposited using any convenient method, for example sputtering, evaporation, chemical vapor deposition, or chemical solution deposition (including electroless plating). The substrate can be provided in a roll form.

In some embodiments of the method of the invention, for example when the method is carried out in a continuous roll-to-roll fashion using a rotary stamp ("rotary mode"), the steps of (a) inking the printing surface of the stamp, (b) treating the inked printing surface, and (c) contacting the treated inked printing surface to a substrate are consecutively performed multiple times.

Figure 1:
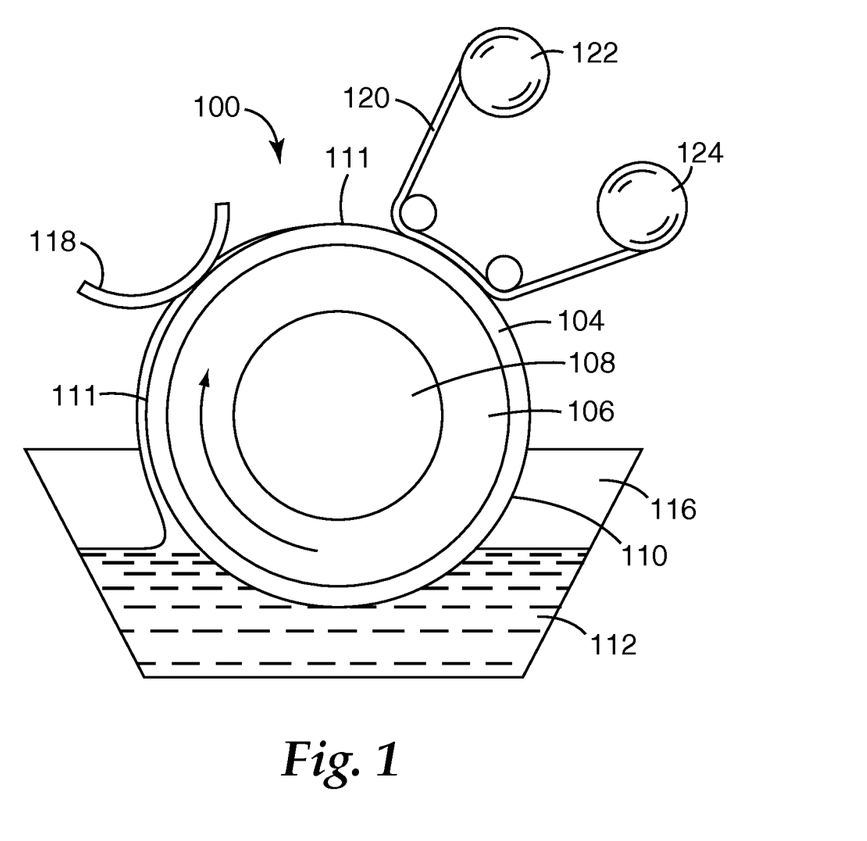
FIG. 1 is a schematic representation of a method of the invention carried out in rotary mode.

FIG. 1 illustrates an embodiment of the method of the invention carried out in rotary mode. Rotary printing tool 100 includes elastomeric stamp 104, which is an elastomeric sleeve, supported by porous stamp support 106, which is a hollow roll. Preferably, porous stamp support 106 comprises a porous metal. The hollow center of porous stamp support 106 serves as an ink reservoir. Ink comprising surface-functionalizing molecules 108 diffuses through porous support 106 and stamp 104 to printing surface 110 to back-side ink stamp 104. Porous substrate 106 and stamp 104 rotate such that inked stamp 104 is coated with solvent 112 by immersing the stamp surface (that is, the printing surface) 110 in solvent in solvent dip tank 116. Excess solvent 112 is removed by doctor blade 118 as stamp 104 rotates and the treated printing surface 111 rotates past doctor blade 118. Treated inked printing surface 111 then rotates into contact with relief-patterned substrate web 120. The web 120 is continuously microcontact printed as it travels from unwind roll 122 to windup roll 124. Alternatively, the method illustrated in FIG. 1 could be carried out using a relief-patterned stamp and a flat (that is, not relief-patterned) substrate, or using a relief-patterned stamp and a relief patterned substrate.

When the method of the invention is carried out in rotary mode, web speeds greater than about 0.03 m/minute, greater than about 1.5 m/minute, or even greater than about 3 m/minute can be achieved. Typically, when the method of the invention is carried out in rotary mode, web speeds will range from about 0.03 m/minute to about 300 m/minute; from about 3.1 m/minute to about 150 m/minute; or from about 3 m/minute to about 30 m/minute.

Although FIG. 1 illustrates carrying out the method of the invention in rotary mode with back-side inking methods, the method of the invention can also be useful in processes in which planar stamps (with or without relief patterning) are back-side inked.

In other embodiments of the method of the invention, an inked stamp is first contacted one or more times with a substrate and is not treated until coverage of the surface-functionalizing molecules begins to deteriorate. The inked printing surface of the stamp can then be treated with solvent to provide extra stamp life (that is, to get more stamps without the need to re-ink the printing surface). The step of contacting the treated inked printing surface of the stamp to the substrate can be repeated 5 times (even 10 times, or even 100 times or more) without re-inking the printing surface of the stamp. The pattern of surface-functionalizing molecules is transferred to a substrate according to the relief pattern(s) with each repeated step of contacting the treated inked printing surface of the stamp to a surface of a substrate. Each time the step of contacting the treated inked printing surface of the stamp to a substrate is repeated, the same substrate or a different substrate may be stamped.

Patterned SAMs formed using the method of the invention can be used, for example, as a resist that protects regions of the underlying substrate surface during a subsequent patterning step. For example, the patterned SAM can provide an etch mask. As an etch mask, the regions of the substrate surface (for example, the surface of a metal coating on a polymeric film substrate) that are covered with the SAM are protected against the chemical action of an etchant, while regions of the substrate surface that are not covered with the SAM are not protected, allowing selective removal of material (for example, metal from a polymeric film substrate) in the unprotected regions.

Alternatively, the patterned SAM can provide a mask for selective deposition of a material (for example, deposition of material in surface regions not containing a SAM and lack of deposition in surface regions containing a SAM). Examples of deposition methods that can be mediated with a printed SAM pattern include electroless plating (U.S. Pat. No. 5,512,131), electrolytic plating (S. Asakura, M. Hirota, and A. Fuwa, "Fabrication of microstructured copper on an indium-tin-oxide surface using a micropatterned self-assembled monolayer as a template," *Journal of Vacuum Science and Technology A*, Vol. 21, No. 4, pp. 1152-1156 (2003)), chemical vapor deposition (N. L. Jeon, R. G. Nuzzo, Y. Xia, M. Mrksich, and G. M. Whitesides, "Patterned self-assembled monolayers formed by microcontact printing direct selective metalization by chemical vapor deposition on planar and nonplanar substrates," *Langmuir*, Vol. 11, No. 8, pp. 3024-3026 (1995)), and chemical solution deposition (P. G. Clem, N. L. Jeon, R. G. Nuzzo, and D. A. Payne, "Micro scale patterning of solution-derived ceramic thin films directed by self-assembled monolayers," *Materials Research Society Symposium Proceedings*, Vol. 435, pp. 521-526 (1996). For example, as a plating mask, the regions of the substrate surface (for example, the surface of a catalytic metal coating on a polymeric film substrate) that are covered with the SAM are rendered non-catalytic for deposition of metal from an electroless plating bath, while regions of the substrate surface that are not covered with the SAM remain exposed and therefore retain their catalytic activity, allowing for the selective placement of electrolessly deposited metal in the unprotected regions. Methodologies for the application of patterned SAMs as masks in the patterning of other materials are known in the art (for example, in U.S. Pat. No. 5,512,131).

EXAMPLES

Objects and advantages of this invention are further illustrated by the following examples, but the particular materials and amounts thereof recited in these examples, as well as other conditions and details, should not be construed to unduly limit this invention.

Cylindrical Plate Fabrication

A cylindrical silicone printing plate with no relief structure was fabricated by centrifugal casting. A glass cylinder measuring approximately 12 inches (30.5 cm) in length and approximately 0.25 inches (0.64 cm) in diameter was placed tightly and concentrically inside a drum, the drum being mounted to and driven by an electric motor. The glass cylinder included end caps. During final assembly of the drum, cylinder, and end caps, 600 g of uncured polydimethylsiloxane (PDMS, Sylgard™ 184, Dow Corning, Midland, Mich.), comprising a 10:1 mixture of base and curing agent was placed into the cylinder. The drum and cylinder were spun at approximately 5 Hz for 24 hours, during which time the PDMS was distributed evenly on the inside surface of the cylinder and partially cured. The cylinder, drum, and end caps were disassembled and the PDMS was removed, in the form of a cylindrical elastomeric sleeve measuring approximately 0.25 inches in thickness. The partially cured PDMS cylinder was cured further in a 90 degrees Celsius oven for approximately 15 minutes.

Rotary Printing Component

A rigid cylindrical support for mounting and inking the above described plate was fabricated using a hollow porous metal (stainless steel) cylinder. The porous metal cylinder was terminated on each end with solid metal (stainless steel) caps welded thereto. The capped cylinder was further extended on each end (from each cap) with shaft sections suitable for mounting with bearings in a roll-to-roll web handling machine. The hollow porous metal mid-section of the support measured approximately 10 inches (25.4 cm) in length, approximately 3 inches (7.6 cm) in inside diameter, with approximately 0.438 inches (1.11 cm) wall thickness. The above described plate was slid onto the rigid cylindrical support. One of the end caps was modified with ports for delivering ink solution to the interior hollow section of the support.

Ink Solution and Inking of the Plate

Ink solutions for printing were prepared by dissolving an alkyl thiol compound in ethanol (200 proof, absolute, anhydrous, Pharmco-Aaper, Shelbyville, Ky.). The ink solutions were prepared with a target concentration. The target concentration was achieved by combining the appropriate masses of alkyl thiol and ethanol, accounting for the molecular weight of the thiol compound and the density of ethanol, as is known in the art. For each example utilizing the above described rotary printing component, approximately 1.4 liters of ink solution was prepared. The alkyl thiol compounds used included hexadecylthiol ("HDT", 1-hexadecanethiol, Alfa-Aesar, Ward Hill, Mass.) and octadecylthiol ("ODT", steryl mercaptan, TCI America, Portland Oreg.). After the thiol compound was dissolved, the solution was charged into the rotary printing component, filling the hollow body. The printing component was mounted into the roll-to-roll machine as described below and allowed to spin at approximately 5 Hz for a specified time ("inking time") before use in printing. During inking, the component was wrapped with plastic film (Saran™ Wrap, S.C. Johnson, Racine, Wis.).

Rotary Printing

For examples utilizing rotary printing, the above described rotary printing component was installed into a roll-to-roll web-handling machine ("small Hirano line", Hirano Tecseed M-200, Hirano Tecseed Company, Japan). The web path and arrangement of components for the machine are depicted schematically in FIG. 1, a side-view. The machine included controls for web speed. The web speed, in combination with the component configuration depicted in FIG. 1, resulted in a controlled time of contact between the substrate and the surface of the printing plate. The arc length of contact between the web and the surface of the printing plate was approximately 5 inches (12.7 cm). In some examples, as noted, the web was paused after the substrate made contact with the printing plate, in order to extend the time of contact between the substrate and the printing plate. For printing, a piece of substrate film was fed between the web and the rotary printing component, with the web serving as a carrier for the piece of substrate film. Solvent treatment was carried out for selected examples using one of a number of approaches. The machine optionally included the solvent dip tank and doctor blade shown in FIG. 1. In all cases where the solvent dip tank was used, the tank was filled with ethanol. In one example, the ethanol was applied to the PDMS stamp by a spraying method, whereby an ethanol squirt bottle as squeezed to release a stream of ethanol. In another example, the ethanol was applied by a swabbing method, whereby a cotton-tipped swab was soaked with ethanol and then used to wipe ethanol onto the PDMS stamp. In yet another example, the ethanol was applied to the stamp by a condensation method, whereby the ethanol was heated to approximately 65 degrees Celsius in a porous metal tube and placed in close proximity to the PDMS stamp in order to allow the solvent vapor to condense onto the stamp surface.

Substrate

Substrates for printing comprised of either channel film or gold-coated film. The channel film was prepared by curing an acrylate resin between a structured tool and a sheet of polyethylene terephthalate (5 mil Melinex, Dupont Teijin Films, Hopewell, Va.)), using an ultraviolet lamp (Blak-Ray XX-15BLB UV Bench Lamp, UVP, Upland, Calif.)), followed by separation from the tool. The curing time was 3 min. The resin formulation was composed of 74.25 wt % Photomer™ 6210 (Cognis, Monheim, Germany), 24.75 wt % SR-238-1,6-Hexanediol diacrylate (Sartomer, Exton, Pa.) and 1.0 wt % Darocur™ 1173 (Ciba Additives, Basel, Switzerland). The topography consisted of 60 μm wide channels running along the width of the film. The structured surface of the substrate film was seeded with a light vapor deposit of palladium using an evaporative coater (Denton Vacuum Coater DV-502A, Denton Vacuum USA, Moorestown, N.J.), the deposit having an average thickness of 5 angstroms and being discontinuous. Gold coated film is comprised of 70 nm of gold evaporated onto PET film. In all cases, either the gold or channel substrates were introduced into the rotary printing tool as sheets (approximately 8 inches×10 inches (20.3 cm×25.4 cm)) that had been taped onto a continuous PET backing roll prior to the actual printing step in order to achieve roll-to-roll printing.

Electroless Plating

After printing, the substrate (small piece measuring approximately 4 inches×8 inches (10.2 cm×20.3 cm) which was cut from the larger sheet of approximately 8 inches×10 inches (20.3 cm×25.4 cm)) was immersed in approximately 700 milliliters of electroless plating solution (MacDermid Inc., Waterburg, Conn.). The plating solution was held at approximately 110 degrees Celsius and the time of plating was 1-2 minutes. After plating, observations were made as to the location of electroless copper deposit on the substrate surface. The localization of electroless copper deposit to the recessed regions of the surface topography is referred to herein as selectivity. A level of selectivity was assigned to each example based on the observations. Selectivity was determined to be "poor" if electroless copper was deposited essentially across the entire surface of the gold or channel film (that is, upon the raised features and within the recessed features of the substrate surface topography). Selectivity was determined to be "fair" if electroless copper was deposited minimally across the printed gold substrate and at least partially preferentially within the recessed features of the channel substrate surface topography, with the term fair also meaning that either i) the electroless copper deposit within the recessed features was somewhat discontinuous (for example, most linear segments less than 2 inches (5.1 cm) in length) or ii) there was more electroless copper deposited atop the raised regions of the substrate surface topography than desired (for example, greater than 10 percent of the raised area included electroless copper deposit, undesirably). Selectivity was determined to be "good" if the electroless copper was nearly absent from the gold substrate or substantially confined to the recessed features of the channel substrate surface topography and the copper deposit was substantially continuous within linear recessed features (for example, continuous traces measuring more than 2 inches (5.1 cm) in length). By substantially confined, what is meant is that the raised regions of the substrate surface topography were essentially free of electroless copper deposit (for example, less than 5 percent of the raised surface feature area included electroless copper deposit, or even less than 2 percent). Selectivity was determined to be "excellent" if the electroless copper was almost entirely confined to the recessed features of the substrate surface topography and the copper deposit was substantially continuous within linear recessed features (for example, continuous traces measuring more than 4 inches (10.2 cm) in length).

Comparative Examples 1-4 and Examples 1-2

Comparative examples 1-4 and examples 1-2 are described in the following paragraphs. All samples were made on the same day using the techniques described above and the roll-to-roll equipment depicted in FIG. 1. The 10 mM ODT thiol in ethanol solution was allowed to diffuse through the cylindrical stamp for 24 hours prior to generating this sample series. A summary of the run conditions and results is presented in Table 1.

Comparative Example 1

Figure 2:
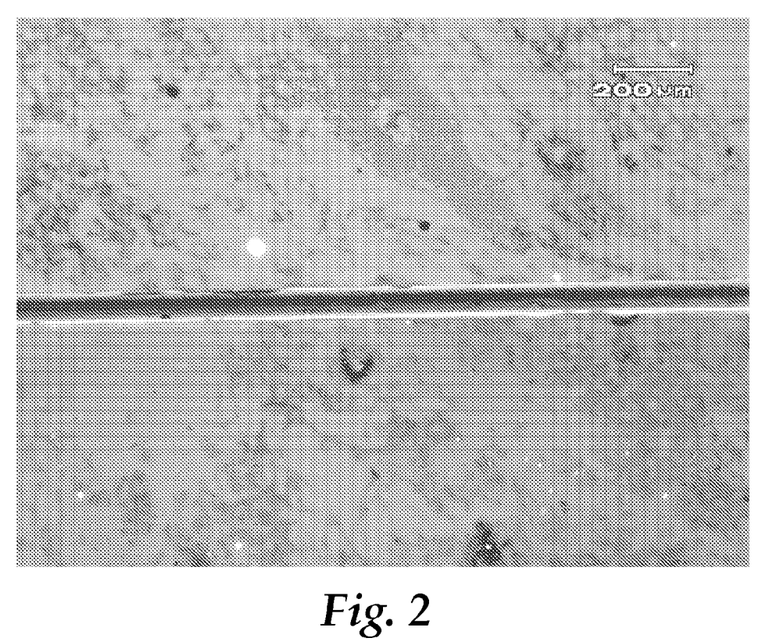
FIG. 2 is a copper plated channel film made according to comparative example 1.

A copper plated channel film was created using the techniques described above. The run condition was 0.4 ft/min (0.12 m/min) line speed, which translated into a 132 second contact time between the substrate and the stamp. No solvent was applied to the stamp prior to printing. A section was cut from the printed sheet and plated in an electroless copper plating bath for 1-2 minutes. This resulted in a sample with copper plating found in both the raised and recessed regions. This result indicated that no thiol had transferred to the substrate and was categorized as "poor". An optical micrograph of this "poor" state is represented in FIG. 2.

Comparative Example 2

A copper plated channel film was created using the techniques described above. The run condition was 0.6 ft/min (0.18 m/min) line speed, which translated into a 90 second contact time between the substrate and the stamp. No solvent was applied to the stamp prior to printing. A section was cut from the printed sheet and plated in an electroless copper plating bath for 1-2 minutes. This resulted in a sample with copper plating found in both the raised and recessed regions. This result indicated that no thiol had transferred to the substrate and was categorized as "poor".

Comparative Example 3

A copper plated channel film was created using the techniques described above. The run condition was 0.1 ft/min (0.03 m/min) line speed. When the substrate was completely in contact with the stamp, the line was stopped and allowed to sit in contact for 2 minutes, translating into a 420 second contact time between the substrate and the stamp. No solvent was applied to the stamp prior to printing. A section was cut from the printed sheet and plated in an electroless copper plating bath for 1-2 minutes. This resulted in a sample with copper plating found in both the raised and recessed regions. This result indicated that no thiol had transferred to the substrate and was categorized as "poor".

Comparative Example 4

A copper plated channel film was created using the techniques described above.

The run condition was 0.1 ft/min (0.03 m/min) line speed. When the substrate was completely in contact with the stamp, the line was stopped and allowed to sit in contact for 30 minutes, translating into an 1800 second contact time between the substrate and the stamp. No solvent was applied to the stamp prior to printing. A section was cut from the printed sheet and plated in an electroless copper plating bath for 1-2 minutes. This resulted in a sample with copper plating found in both the raised and recessed regions. This result indicated that no thiol had transferred to the substrate and was categorized as "poor".

Example 1

A copper plated channel film was created using the techniques described above. The run condition was 0.1 ft/min (0.03 m/min) line speed. Just prior to the substrate sheet being brought into contact with the stamp, ethanol was sprayed onto the surface of the stamp. When the substrate was completely in contact with the stamp, the line was stopped and allowed to sit in contact for 15 minutes, translating into a 420 second contact time between the substrate and the stamp. A section was cut from the printed sheet and plated in an electroless copper plating bath for 1-2 minutes. The substrate was clearly "wet" with ethanol during contact and was still "wet" when removed, but this allowed thiol transfer to take place. However, there were breaks in the Cu plated lines assumed to be due to thiol transport in the ethanol liquid that entered the channels, resulting in a "fair" sample.

Example 2

A copper plated channel film was created using the techniques described above. The run condition was 0.1 ft/min (0.03 m/min) line speed. Just prior to the substrate sheet being brought into contact with the stamp, ethanol was swabbed onto the surface of the stamp. When the substrate was completely in contact with the stamp, the line was stopped and allowed to sit in contact for 15 minutes, translating into a 600 second contact time between the substrate and the stamp. A section was cut from the printed sheet and plated in an electroless copper plating bath for 1-2 minutes. This process proved to be "wet" as well, although less so compared to example 1. It did successfully result in thiol transfer; however, swabbing also produced a non-uniform transfer, resulting in a "fair" sample.

Examples 3-5

Examples 3-5 are described in the following paragraphs. All samples were made on the same day using the techniques described above and the roll-to-roll equipment depicted in FIG. 1. The 10 mM ODT thiol in ethanol solution was allowed to diffuse through the printing plate for 18 hours prior to generating this sample series. Application of solvent was done using the dip tank for this sample series, and, in some cases, the solvent was treated with a doctor blade prior to contact between the substrate and the printing plate. A summary of the run conditions and results is presented in Table 1.

Example 3

A copper plated channel film was created using the techniques described above. The run condition was 0.4 ft/min (0.12 m/min) line speed, which translated into a contact time of 45 seconds. Just prior to the substrate sheet being brought into contact with the printing plate, ethanol was applied to the printing plate by the dip coating method, followed by treatment with a doctor blade. A section was cut from the printed sheet and plated in an electroless copper plating bath for 1-2 minutes. This sample was categorized as "fair".

Example 4

A copper plated channel film was created using the techniques described above. The run condition was 0.2 ft/min (0.06 m/min) line speed, which translated into a contact time of 100 seconds. Just prior to the substrate sheet being brought into contact with the printing plate, ethanol was applied to the printing plate by the dip coating method, but was not treated with a doctor blade. A section was cut from the printed sheet and plated in an electroless copper plating bath for 1-2 minutes. This sample was categorized as "good".

Example 5

Figure 3:
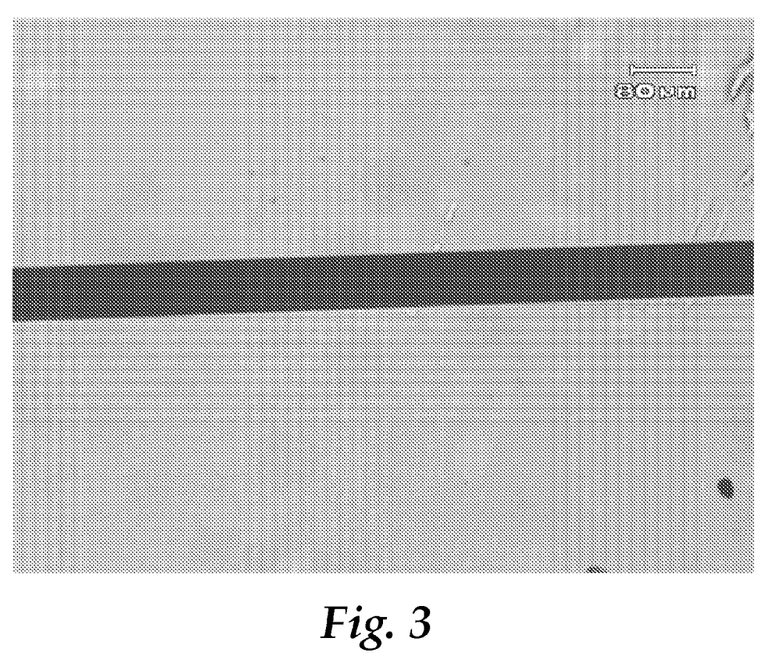
FIG. 3 is a copper plated channel film made according to example 5.

A copper plated channel film was created using the techniques described above. The run condition was 0.2 ft/min (0.06 m/min) line speed, which translated into a contact time of 100 seconds. Just prior to the substrate sheet being brought into contact with the printing plate, ethanol was applied to the printing plate by the dip coating method, followed by treatment with a doctor blade. (Note from Table 1. that there is a Y* associated with this example regarding the doctor blade treatment step. This is meant to indicate that an extra step was taken to ensure that there was a bead of ethanol formed behind the doctor blade prior to running the substrate through. This was accomplished by temporarily speeding up the line speed until the bead was visually evident. The line speed was then brought to the actual speed used for printing.) A section was cut from the printed sheet and plated in an electroless copper plating bath for 1-2 minutes. This sample was categorized as "excellent". An optical micrograph of this "excellent" state is represented in FIG. 3.

Examples 6-9

Examples 6-9 are described in the following paragraphs. All samples were made using the techniques described above and the roll-to-roll equipment depicted in FIG. 1. Gold coated substrate was used instead of channel substrate. The 10 mM ODT thiol in ethanol solution was allowed to diffuse through the printing plate for 18-24 hours. Application of solvent was done using either the condensation or dip tank method. In some cases, the solvent was treated with a doctor blade prior to contact between the substrate and the printing plate. A summary of the run conditions and results is presented in Table 2.

Example 6

A gold coated film was created using the techniques described above. The run condition was 0.4 ft/min (0.12 m/min) line speed, which translated into a contact time of 90 seconds. Just prior to the substrate sheet being brought into contact with the printing plate, ethanol was applied to the printing plate by the condensation method, but was not treated with a doctor blade. A section was cut from the printed sheet and plated in an electroless copper plating bath for 1-2 minutes. This sample was categorized as "fair".

Example 7

A gold coated film was created using the techniques described above. The run condition was 0.4 ft/min (0.12 m/min) line speed, which translated into a contact time of 90 seconds. Just prior to the substrate sheet being brought into contact with the printing plate, ethanol was applied to the printing plate by the condensation method, followed by treatment with a doctor blade. A section was cut from the printed sheet and plated in an electroless copper plating bath for 1-2 minutes. This sample was categorized as "good".

Example 8

A gold coated film was created using the techniques described above. The run condition was 0.4 ft/min (0.12 m/min) line speed, which translated into a contact time of 45 seconds. Just prior to the substrate sheet being brought into contact with the printing plate, ethanol was applied to the printing plate by the dip tank method, but was not treated with a doctor blade. A section was cut from the printed sheet and plated in an electroless copper plating bath for 1-2 minutes. This sample was categorized as "fair".

Example 9

A gold coated film was created using the techniques described above. The run condition was 0.7 ft/min (0.21 m/min) line speed, which translated into a contact time of 30 seconds. Just prior to the substrate sheet being brought into contact with the printing plate, ethanol was applied to the printing plate by the condensation method, followed by treatment with a doctor blade. A section was cut from the printed sheet and plated in an electroless copper plating bath for 1-2 minutes. This sample was categorized as "good".

Planar Stamp with Relief Structure Fabrication

A silicone printing stamp with surface relief patterned onto the printing side was fabricated by casting the silicone against a master tool, having the desired pattern, made from photolithography. The master tool was made on a 4 inch (10.2 cm) or larger size silicon wafer or glass substrate. Uncured polydimethylsiloxane (PDMS, Sylgard™ 184, Dow Corning, Midland, Mich.), comprising a 10:1 mixture of base and curing agent (formulation per the manufacturer's recommendation) was placed into a casting dish that contained the master tool. The cast silicone was allowed to cure at room temperature for 24 hours, during which time the PDMS was distributed evenly onto the master tool and partially cured. The partially cured PDMS stamp was removed from the master tool and cured further in a 90 degrees Celsius oven for approximately 15 minutes.

Printing with Planar Stamp with Relief Structure

The following examples illustrate the use of solvent treatment when patterning flat metal-coated substrates with a silicone planar stamp with relief structure made by the method described above. The cured structured stamp was inked through the back, unstructured side, of the stamp, also referred to as back-inking, for a predetermined period of time to establish an inked surface on the structured side of the stamp. This stamp was then dried of excess liquid ink from the back side and placed onto a flat surface, with the relief structured side facing up. A piece of the metal coated flat substrate

TABLE 1

Comparative Examples C1-C4 and Examples 1-5.

| Example No. | Alkylthiol | Alkylthiol Concentration (millimolar) | Film Type | Web Speed (feet per minute) | Total Substrate Contact Time to Plate (seconds) | Application of Solvent to the Printing Plate During Printing | Doctor Blade Used to Spread Solvent (Y/N) | Web Was Stopped to Allow Longer Substrate Contact Time to Plate (Y/N) | Selectivity of Plating into Recessed Regions |
|---|---|---|---|---|---|---|---|---|---|
| C1 | ODT | 10 | channel | 0.4 | 132 | None | N | N | Poor |
| C2 | ODT | 10 | channel | 0.6 | 90 | None | N | N | Poor |
| C3 | ODT | 10 | channel | 0.1 | 420 | None | N | Y | Poor |
| C4 | ODT | 10 | channel | 0.1 | 1800 | None | N | Y | Poor |
| 1 | ODT | 10 | channel | 0.1 | 90 | Spray | N | Y | Fair |
| 2 | ODT | 10 | channel | 0.1 | 600 | Swab | N | Y | Fair |
| 3 | ODT | 10 | channel | 0.4 | 45 | Dip | Y | N | Fair |
| 4 | ODT | 10 | channel | 0.2 | 100 | Dip | N | N | Good |
| 5 | ODT | 10 | channel | 0.2 | 100 | Dip | Y* | N | Excellent |

TABLE 2

Examples 6-9

| Example No. | Alkylthiol | Alkylthiol Concentration (millimolar) | Film Type | Web Speed (feet per minute) | Total Substrate Contact Time to Plate (seconds) | Application of Solvent to the Printing Plate During Printing | Doctor Blade Used to Spread Solvent (Y/N) | Web Was Stopped to Allow Longer Substrate Contact Time to Plate (Y/N) | Selectivity of Plating into Recessed Regions |
|---|---|---|---|---|---|---|---|---|---|
| 6 | ODT | 10 | gold | 0.4 | 90 | Condense | N | N | Fair |
| 7 | ODT | 10 | gold | 0.4 | 90 | Condense | Y | N | Good |
| 8 | ODT | 10 | gold | 0.4 | 45 | Dip | N | N | Fair |
| 9 | ODT | 10 | gold | 0.7 | 30 | Dip | Y | N | Good | was cut to a size comparable to the overall pattern size. Gold coated film is comprised of 70 nm of gold evaporated onto PET film. Silver coated film is comprised of 100 nm of silver evaporated onto PET film. The substrate was positioned on one end of the stamp with the metal side facing the stamp and rolled into contact with the stamp using a soft roller, thus creating a contact front to allow air to escape during contact. The stamp-substrate was allowed to be contacted for a predetermined amount of time to allow transfer of the functionalizing molecules. The substrate was then peeled from the stamp by hand and etched in a bath as described below, revealing a patterned metal structure on the substrate.

Solvent Treatment of Planar Stamps with Relief Structure

As the stamp is used for multiple prints, the quality of the prints can degrade. The number of prints that a single stamp can achieve after being inked is dependent on parameters such as stamp thickness, ink concentration and pattern geometry. This depleted state of the stamp can also be achieved by allowing the inked stamp to purposely dry out on a bench top or by actively drying it with a stream of compressed nitrogen. In order to return the stamp surface to its original quality printing state, inclusion of a solvent treatment step was added. It consists of directly applying solvent to the relief structured side of the inked stamp, where it is allowed to sit for a predetermined amount of time and then dried off with compressed nitrogen, yielding a nominally dry surface once again. The solvent can be applied in several ways. In these examples it was squirted onto the stamp surface from a solvent squirt bottle to form a continuous coating on the surface of the stamp.

Etching

Printed substrates were patterned by a wet chemical etch process. The particular etching chemistry used and etching time are determined by the type of metal coating its thickness. For gold coated substrates an etchant solution consisting of 1.0176 g thiourea (99.9%, Aldrich, Milwaukee, Wis.), 0.55 mL HCl (36.5-38%, J.T. Baker, Phillipsburg, Mass.), 0.5 mL $H_2O_2$ (30%, Mallinckrodt Baker, Inc. Phillipsburg, Mass.) and 21 g deionized water was used. For silver coated substrates an etchant solution consisting of 0.02 M ferric nitrate nonahydrate (98+%, EMD, Darmstadt, Germany), and 0.03 M thiourea (99.9%, Aldrich, Milwaukee, Wis.) was used.

Print Quality Determination

The quality of the printed and etched examples were analyzed using imaging software in order to compare the quality before and after the solvent assist step was included. The software used was ImageJ and the images imported for analysis were taken with an optical microscope at 40× or 80× magnification. For each example analyzed, the image was taken from the same patterned feature region so that an accurate comparison could be performed. The output of this analysis was mean optical density (based on a scale of 0-256, where 0 is the black state and 256 is the white state). In this case, the lower mean value corresponds to better print quality. For comparison purposes, this mean value was used to calculate a protection factor. The protection factor is a number between 0-1, and has been normalized to account for baseline black and white states in the image sets. For comparative examples 5 and 10, the black value was 10 and the white value was 250. For comparative examples 6 and 7 and examples 11-13, the black value was 18 and the white value was 112. A protection factor of 0 means that there was no transfer of the functionalizing molecules from the stamp during printing and, hence, no patterned feature is present. A protection factor of 1 means that there was complete transfer of the functionalizing molecules in the regions of interest and, hence, a perfect pattern is generated. Typically, the protection factor falls between 0 and 1 and so is a measure of the defects in the functionalizing molecule coverage.

Protection Factor=((white−black)−(mean−black))/(white−black)

These values were then related to a qualitative assignment of "good" or "poor" quality based on the following scale: 0.0-0.7 is "poor", and 0.71-1.0 is "good".

Comparative Example 5 and Example 10

Comparative example 5 and example 10 are described in the following paragraphs. They were made using 70 nm thick gold-coated PET substrates. The ink was a 10 mM C18 in ethanol solution. In addition, the stamp was cleaned of dust and debris between each print using tape. Print time for examples 15 and 16 was held at 40 seconds. In the cases where solvent assist was used, it was applied in the manner described above. The structured stamp was back inked for 17 hours prior to use. Prior to generating examples 15 and 16, the stamp was used for 14 successive prints (without the use of a solvent assist step) and was dried under a nitrogen stream for 5 minutes between each print to enhance drying of the stamp. The stamp was then allowed to dry in a vented hood (flowing air at 75 ft/min) for 16 hours. With this history, example 15 was then produced, again without a solvent assist step. This produced a poor print quality rating. Example 16 was then immediately printed, but with a solvent treatment step, which produced a good print quality rating. Table 3 summarizes the test parameters and results from each example.

Comparative Example 5

Figure 4:
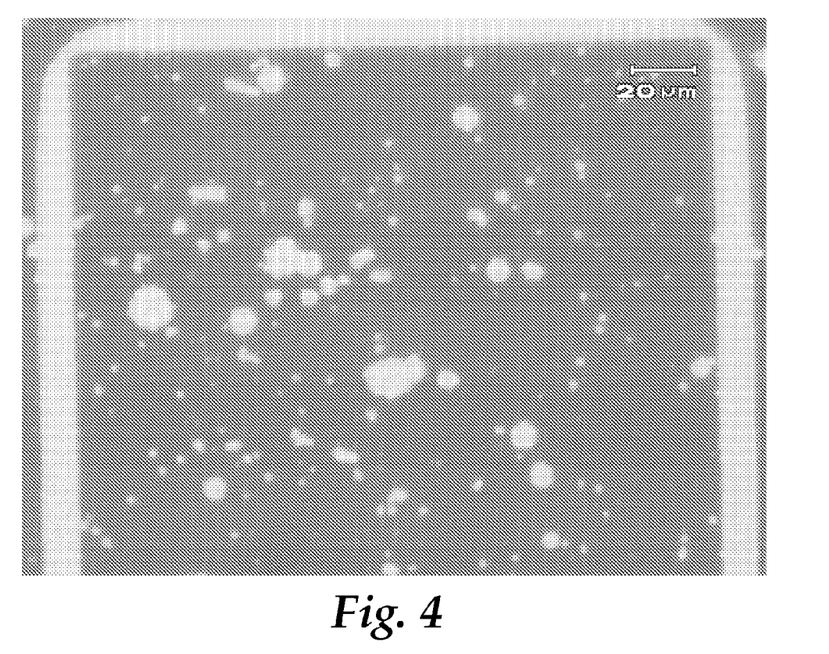
FIG. 4 is a printed substrate made according to comparative example 5.

The stamp used to generate comparative example 5 had been used previously, as described above, until its ability to transfer functionalizing molecules to the substrate had deteriorated. No solvent treatment was used prior to printing example 15. FIG. 4 illustrates the print quality of comparative example 5. This sample was analyzed using image software, yielding a protection factor of 0.60. It was categorized as "poor".

Example 10

Figure 5:
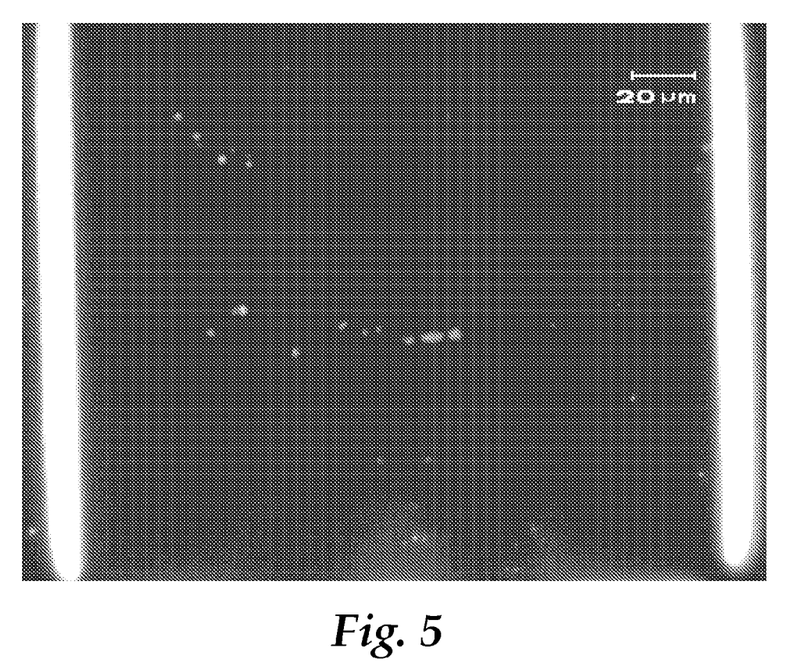
FIG. 5 is a printed substrate made according to example 10.

Example 10 was generated immediately after comparative example 5. Solvent assist was used as described before. The solvent used was ethanol and it was allowed to stay in contact with the surface of the stamp for 5 minutes before being dried. FIG. 5 illustrates the print quality of example 10. This sample was analyzed using image software, yielding a protection factor of 0.80. It was categorized as "good".

Comparative Examples 6 and 7 and Examples 11-13

Comparative examples 6 and 7 and Examples 11-13 are described in the following paragraphs. They were made using 100 nm thick silver-coated PET substrates. The ink was a 5 mM C18 in ethanol solution. In addition, the stamp was cleaned of dust and debris between each print using tape. Print time for examples 17-21 was held at 40 seconds. In the cases where solvent assist was used, it was applied in the manner described above. The structured stamp was back inked for 3 hours prior to use. Prior to generating these examples, the stamp was used for 20 successive prints (without the use of a solvent treatment step). Prints 1-11 were produced on the same day in sequential order and included a drying step between each print (ranging from 1-30 minutes under flowing nitrogen). The stamp was then allowed to sit in a vented hood (75 ft/min air flow), covered with a vented aluminum foil cover, for 72 hours. Following this, prints 13-21 were produced (again with a drying step between each print for times ranging from 1-35 minutes under flowing nitrogen). No solvent treatment step was used. With this history, comparative example 5 was then produced, again without a solvent treatment step. This produced a poor print quality rating. Example 10 was then immediately printed, but with a solvent treatment step, which produced a good print quality rating. Table 3 summarizes the test parameters and results from each example.

Comparative Example 6

Comparative example 6 was generated given the stamp history described above. No solvent treatment was used prior to printing comparative example 6. This sample was analyzed using image software, yielding a protection factor of 0.66. It was categorized as "poor".

Example 11

Example 11 was generated immediately after comparative example 6. Solvent treatment was used as described before. The solvent used was acetone and it was allowed to stay in contact with the surface of the stamp for 5 minutes before being dried. This sample was analyzed using image software, yielding a protection factor of 0.81. It was categorized as "good".

Comparative Example 7

Figure 6:
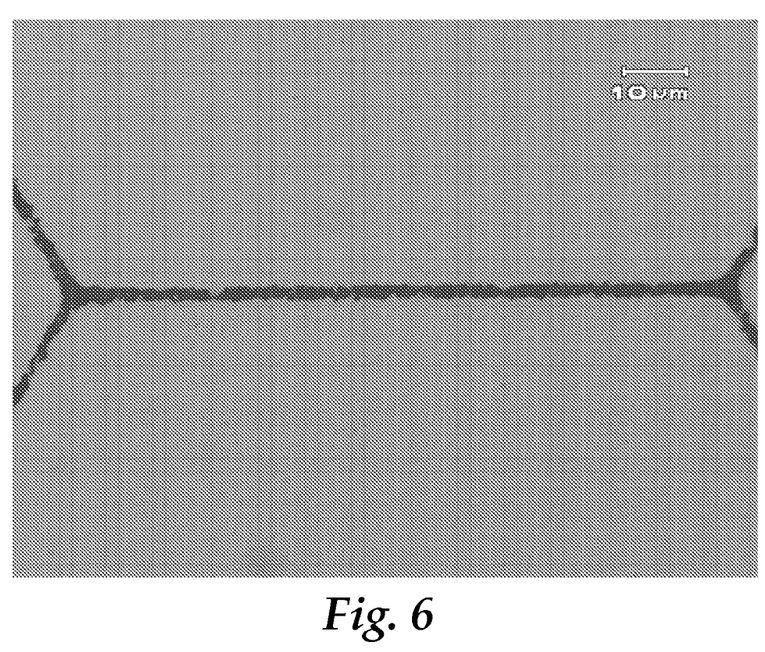
FIG. 6 is a printed substrate made according to comparative example 7.

After example 11, the stamp was left in a vented hood as described above, exposed to ethanol and then dried for 10 minutes under a nitrogen stream. Example comparative example 7 was then generated. No solvent treatment was used immediately prior to printing comparative example 7. FIG. 6 illustrates the print quality of comparative example 7. This sample was analyzed using image software, yielding a protection factor of 0.52. It was categorized as "poor".

Example 12

Figure 7:
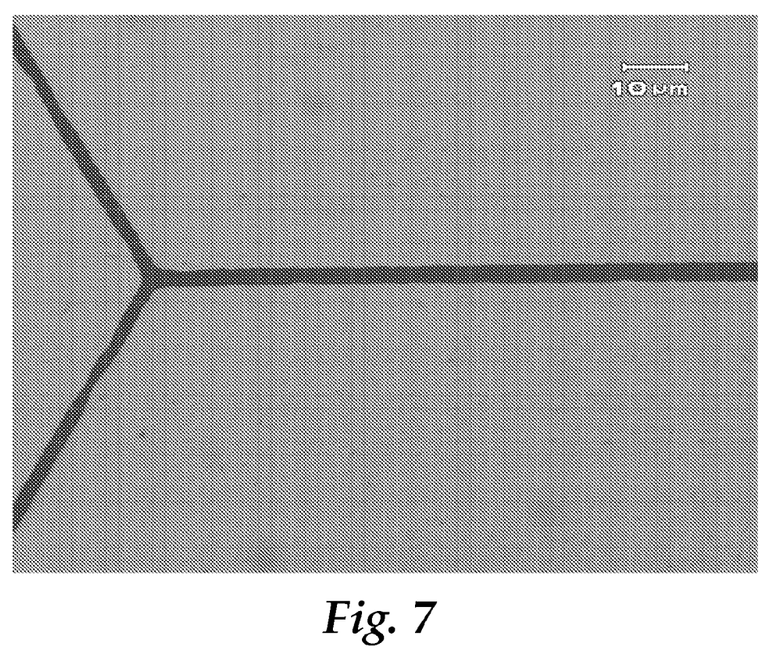
FIG. 7 is a printed substrate made according to example 12.

Example 12 was generated immediately after comparative example 7. Solvent treatment was used as described before. The solvent used was pyridine and it was allowed to stay in contact with the surface of the stamp for 5 minutes before being dried. FIG. 7 illustrates the print quality of example 12. This sample was analyzed using image software, yielding a protection factor of 0.90. It was categorized as "good".

Example 13

After example 12, the stamp had been soaked in pyridine for a total of 40 minutes and dried thoroughly, yielding a poor print state. Example 13 was then generated and a solvent treatment step was used. The solvent used was hexane and it was allowed to stay in contact with the surface of the stamp for 3 minutes before being dried. This sample was analyzed using image software, yielding a protection factor of 0.89. It was categorized as "good".

TABLE 3

Comparative Examples C5-C7 and Examples 10-13.

| Example No. | Solvent Assist (Y or N) | Solvent Type | Solvent Soak Time (min) | Mean OD | Protection Factor | Rating |
|---|---|---|---|---|---|---|
| C5 | N | N/A | N/A | 106.4 | 0.6 | Poor |
| 10 | Y | Ethanol | 5 | 57.2 | 0.8 | Good |
| C6 | N | N/A | N/A | 46.3 | 0.66 | Poor |
| 11 | Y | Acetone | 5 | 30.9 | 0.81 | Good |
| C7 | N | N/A | N/A | 59.9 | 0.52 | Poor |
| 12 | Y | Pyridine | 5 | 21.9 | 0.9 | Good |
| 13 | Y | Hexane | 3 | 23.1 | 0.89 | Good |

The complete disclosures of the publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A method of microcontact printing comprising:
   (a) providing an elastomeric stamp comprising a printing surface inked with an ink comprising surface-functionalizing molecules that forms a self-assembled monolayer;
   (b) treating the inked printing surface of the stamp with solvent to provide a treated inked printing surface; and
   (c) contacting the treated inked printing surface of the stamp to a surface of a substrate;
   wherein the printing surface of the stamp comprises a first relief pattern printing surface with the treated ink entirely thereon, or the surface of the substrate comprises a second relief pattern, or both of the surfaces comprise the relief patterns; and
   wherein a pattern of surface-functionalizing molecules is transferred to the substrate according to one or both of the relief patterns.

2. The method of claim 1 wherein the inked printing surface of the stamp comprises poly(dimethylsiloxane).

3. The method of claim 1 wherein the surface-functionalizing molecules are selected from the group consisting of organosulfur compounds, organosilanes, alkylphosphonic acids, carboxylic acids, and benzotriazoles.

4. The method of claim 1 wherein providing an elastomeric stamp comprising a printing surface inked with surface-functionalizing molecules comprises back-side inking the stamp.

5. The method of claim 1 wherein the solvent comprises ethanol.

6. The method of claim 1 wherein the solvent has a poly(dimethylsiloxane) swelling ratio greater than about 1.0 and less than about 2.0.

7. The method of claim 1 wherein treating the inked printing surface of the stamp with solvent comprises dip coating, blade coating, condensation coating, vapor-treating, roll coating, or slot coating.

8. The method of claim 1 wherein the inked printing surface of the stamp is in contact with the solvent for less than 10 minutes.

9. The method of claim 1 further comprising removing excess solvent from the treated inked printing surface of the stamp.

10. The method of claim 9 wherein removing excess solvent from the treated inked printing surface of the stamp comprises using a doctor blade.

11. The method of claim 1 further comprising drying the treated inked printing surface of the stamp such that the printing surface is free of bulk liquid.

12. The method of claim 1 wherein the method is carried out in a rotary mode.

13. The method of claim 12 wherein the method is carried out in a rotary mode at a web speed greater than about 0.03 m/minute.

14. The method of claim 13 wherein the web speed is greater than about 1.5 m/minute.

15. The method of claim 1 wherein the step of contacting the treated inked printing surface of the stamp to a surface of a substrate is repeated at least 5 times without re-inking the printing surface of the stamp, and wherein a pattern of surface-functionalizing molecules is transferred to a substrate according to one or both of the relief patterns with each repeated step of contacting the treated inked printing surface of the stamp to a surface of a substrate.

16. The method of claim 1 wherein the step of contacting the treated inked printing surface of the stamp to a surface of a substrate is repeated at least 10 times without re-inking the printing surface of the stamp, and wherein a pattern of surface-functionalizing molecules is transferred to a substrate according to one or both of the relief patterns with each repeated step of contacting the treated inked printing surface of the stamp to a surface of a substrate.

17. The method of claim 1 wherein the step of contacting the treated inked printing surface of the stamp to a surface of a substrate is repeated at least 100 times without re-inking the printing surface of the stamp, and wherein a pattern of surface-functionalizing molecules is transferred to a substrate according to one or both of the relief patterns with each repeated step of contacting the treated inked printing surface of the stamp to a surface of a substrate.

18. The method of claim 1 wherein the printing surface of the stamp comprises a first relief pattern and the surface of the substrate does not comprise a relief pattern.

19. The method of claim 1 wherein the surface of the substrate comprises a second relief pattern and the printing surface of the stamp does not comprise a relief pattern.

20. The method of claim 1 further comprising etching the portions of the substrate not containing the surface-functionalizing molecules.

21. The method of claim 1 further comprising using the pattern of surface-functionalized molecules as a mask and selectively depositing of a material onto the portions of the substrate not containing the surface-functionalizing molecules.

22. The method of claim 1 further comprising plating the portions of the substrate not containing the surface-functionalizing molecules.

* * * * *

UNITED STATES PATENT AND TRADEMARK OFFICE
CERTIFICATE OF CORRECTION

PATENT NO. : 9,003,970 B2  
APPLICATION NO. : 13/000846  
DATED : April 14, 2015  
INVENTOR(S) : Berniard et al.

It is certified that error appears in the above-identified patent and that said Letters Patent is hereby corrected as shown below:

In the Specification

Column 1,  
Line 9, delete "of" and insert -- to --, therefor.  
Line 10, delete "Jun. 30,2008," and insert -- Jun. 30, 2008, --, therefor.

Column 4,  
Line 44, delete "formulations" and insert -- formulations. --, therefor.

Signed and Sealed this  
Fifteenth Day of September, 2015

Michelle K. Lee  
*Director of the United States Patent and Trademark Office*